US012757555B2

(12) United States Patent
Chen et al.

(10) Patent No.: US 12,757,555 B2
(45) Date of Patent: Oct. 6, 2026

(54) LIGHTING MODULE, ELECTRONIC DEVICE, AND DISPLAY PANEL

(71) Applicant: LITE-ON TECHNOLOGY CORPORATION, Taipei City (TW)

(72) Inventors: Wei-Liang Chen, New Taipei City (TW); Chung-Chan Wu, Taipei City (TW); Wen-Chien Lai, New Taipei City (TW); Han-Hsing Peng, New Taipei City (TW)

(73) Assignee: LITE-ON TECHNOLOGY CORPORATION, Taipei City (TW)

( * ) Notice: Subject to any disclaimer, the term of this patent is extended or adjusted under 35 U.S.C. 154(b) by 582 days.

(21) Appl. No.: 18/224,260

(22) Filed: Jul. 20, 2023

(65) Prior Publication Data

US 2024/0030233 A1 Jan. 25, 2024

Related U.S. Application Data

(60) Provisional application No. 63/391,072, filed on Jul. 21, 2022.

(30) Foreign Application Priority Data

Jul. 7, 2023 (CN) ........................ 202310829466.1

(51) Int. Cl.
*H10H 29/24* (2026.01)
*H10H 20/833* (2025.01)
*H10W 90/00* (2026.01)

(52) U.S. Cl.
CPC .......... *H10H 29/24* (2025.01); *H10H 20/833* (2025.01); *H10W 90/00* (2026.01)

(58) Field of Classification Search
CPC ... H10H 29/24; H10H 20/833; H01L 25/0753
See application file for complete search history.

(56) References Cited

U.S. PATENT DOCUMENTS

2007/0284586 A1* 12/2007 Park ...................... H10D 86/40 257/72
2015/0028376 A1* 1/2015 Corwin ............... H01L 25/0753 257/99

FOREIGN PATENT DOCUMENTS

KR 20160083589 A * 7/2016 ........... G02F 1/1368

* cited by examiner

*Primary Examiner* — Peter M Albrecht
(74) *Attorney, Agent, or Firm* — Li & Cai Intellectual Property (USA) Office

(57) ABSTRACT

A lighting module, an electronic device, and a display panel are provided. The lighting module includes a carrier, a first metal circuit layer, a first transparent conductive layer, a first insulating layer, a second transparent conductive layer, a second metal circuit layer, a bonding structure layer, and a plurality of lighting units. The bonding structure layer is configured to allow the second metal circuit layer to be well bonded to the first insulating layer, so that a resistance value of the lighting module is decreased, and a pressure drop is reduced.

19 Claims, 8 Drawing Sheets

LIGHTING MODULE, ELECTRONIC DEVICE, AND DISPLAY PANEL

CROSS-REFERENCE TO RELATED PATENT APPLICATION

This application claims the benefit of priorities to the U.S. Provisional Patent Application Ser. No. 63/391,072 filed on Jul. 21, 2022, and China Patent Application No. 202310829466.1 filed on Jul. 7, 2023 in People's Republic of China. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a lighting module, an electronic device, and a display panel, and more particularly to a lighting module capable of decreasing a circuit resistance value and minimizing crosstalk among lighting units.

BACKGROUND OF THE DISCLOSURE

A micro light-emitting diode (μLED) represents a new generation lighting technology, which has not only the characteristics of a light-emitting diode but also advantages of a small size, a light weight, high brightness, long lifespan, low power consumption, short response time, high controllability, etc. The μLED is gradually applied to technological developments of a display device.

However, during application of the μLED in the display device, a number of technical issues remain to be solved. For example, the μLED includes an electronic substrate, and a conductive circuit of the electronic substrate has a high resistance value, thereby causing a high pressure drop at two ends of the μLED. Hence, the brightness is decreased, and the brightness of a whole surface is not uniform.

Furthermore, crosstalk often occurs among pixel arrays of a display panel of the existing μLED, such that the lighting quality is negatively affected.

Therefore, how to reduce the pressure drop caused by electrical resistance, ensure lighting performance of the μLED, and minimize the crosstalk among pixels through an improvement in structural design of the electronic substrate, so as to overcome the above-mentioned problems, has become one of the important issues to be solved in this industry.

SUMMARY OF THE DISCLOSURE

In response to the above-referenced technical inadequacies, the present disclosure provides a lighting module, an electronic device, and a display panel capable of decreasing a resistance value of a driving circuit, reducing a pressure drop, and minimizing crosstalk among lighting units.

In order to solve the above-mentioned problems, one of the technical aspects adopted by the present disclosure is to provide a lighting module, which includes: a carrier, a first metal circuit layer, a first transparent conductive layer, a first insulating layer, a second transparent conductive layer, a bonding structure layer, a second metal circuit layer, and a plurality of lighting units. A bonding portion is disposed between a surface of the first insulating layer and the second metal circuit layer. The lighting units are arranged corresponding on the second metal circuit layer. A positive electrode and a negative electrode of each of the lighting units are connected to the first circuit portion and the second circuit portion, respectively.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
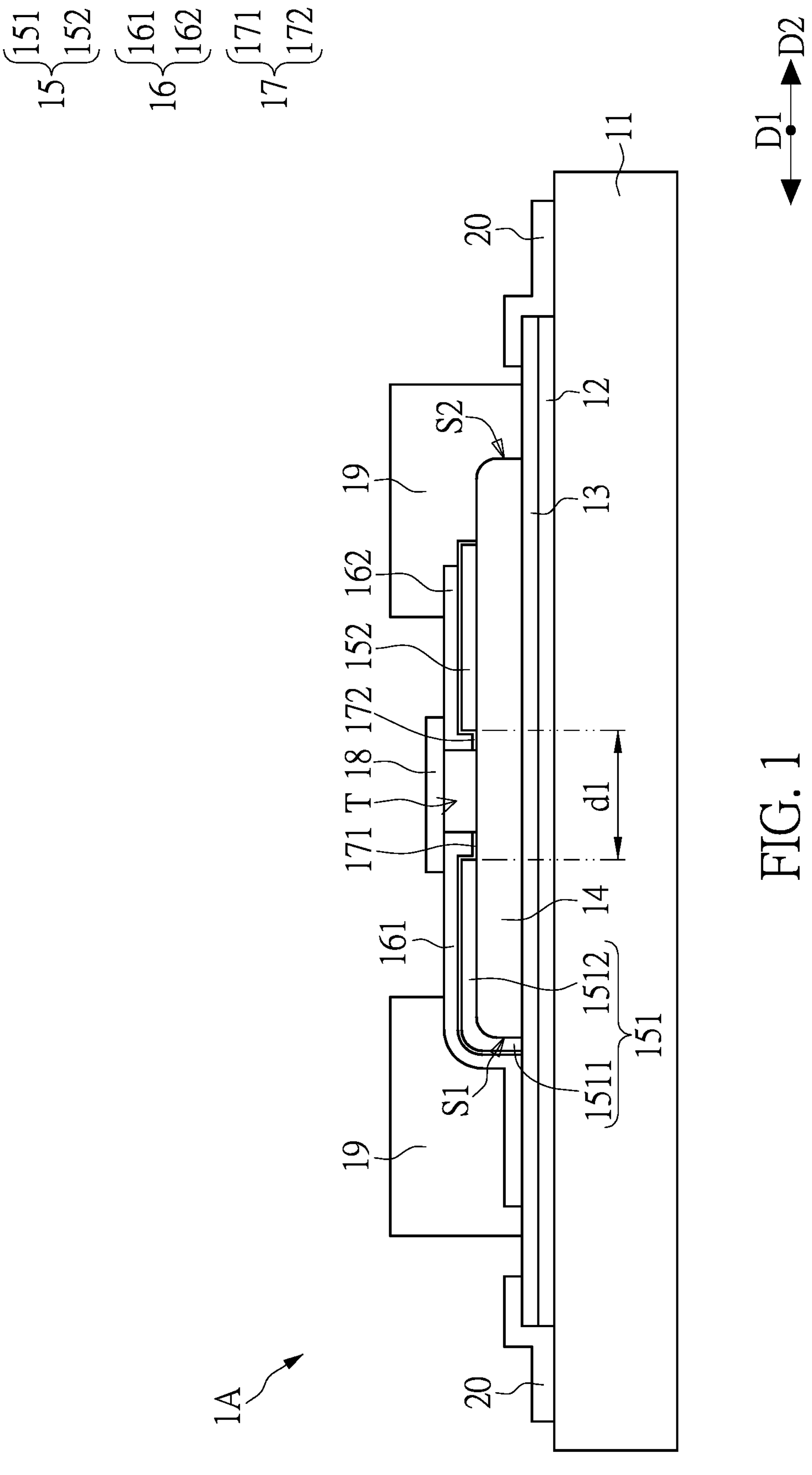
FIG. 1 is a front view of a lighting module according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as “first,” “second” or “third” can be used to describe various components, signals or the like, which are for distinguishing one component/signal from another one only, and are not intended to, nor should be construed to impose any substantive limitations on the components, signals or the like.

Reference is made to FIG. 1, which is a front view of a lighting module 1A according to one embodiment of the present disclosure. The lighting module 1A includes a carrier 11, a first metal circuit layer 12, a first transparent conductive layer 13, a first insulating layer 14, a second transparent conductive layer 15, a second metal circuit layer 16, a bonding structure layer 17, and a plurality of lighting units 18. The first metal circuit layer 12 extends along a first direction D1, and is disposed on the carrier 11. The first transparent conductive layer 13 extends along the first direction D1, and covers the first metal circuit layer 12. Connection pads 20 are disposed on two sides of the first metal circuit layer 12 and the first transparent conductive layer 13. The first insulating layer 14 is disposed on the first transparent conductive layer 13, and two sides of the first insulating layer 14 are respectively defined as a first side S1 and a second side S2. The second transparent conductive layer 15 includes a first conductive portion 151 and a second conductive portion 152. The first conductive portion 151 is connected to the first transparent conductive layer 13 and covers one portion of the first insulating layer 14, the second conductive portion 152 is disposed on another portion of the first insulating layer 14, and a pitch d1 is defined between the second conductive portion 152 and the first conductive portion 151. The second metal circuit layer 16 includes a first circuit portion 161 and a second circuit portion 162. The first circuit portion 161 extends along the first direction D1 and covers the first conductive portion 151, the second circuit portion 162 extends along a second direction D2 and covers the second conductive portion 152, and a groove T is formed between the second circuit portion 162 and the first circuit portion 161. The bonding structure layer 17 includes a first bonding portion 171 and a second bonding portion 172. The first bonding portion 171 is disposed between a surface of the first insulating layer 14 and the first circuit portion 161. The second bonding portion 172 is disposed between the surface of the first insulating layer 14 and the second circuit portion 162. Specifically, the bonding structure layer 17 is disposed and extends between the second transparent conductive layer 15 and the second metal circuit layer 16. The first bonding portion 171 extends along the first direction D1, and is disposed between the first circuit portion 161 and the first conductive portion 151. The second bonding portion 172 extends along the second direction D2, and is disposed between the second circuit portion 162 and the second conductive portion 152. The lighting units 18 are arranged corresponding to the groove T. In addition, a positive electrode and a negative electrode at a bottom portion of each of the lighting units 18 are connected to the first circuit portion 161 and the second circuit portion 162, respectively. That is, the first conductive portion 151 can provide a common anode circuit structure for the lighting units 18 arranged along the first direction D1, and multiple ones of the second conductive portion 152 enable the corresponding lighting units 18 to light up independently. Such a configuration not only reduces connection circuits between the lighting module 1A and the outside but is also space efficient for the carrier 11.

As shown in the embodiment of FIG. 1, the second conductive portions 152 are arranged to be spaced apart from each other along the first direction D1. Multiple ones of the second circuit portion 162 are arranged to be spaced apart from each other along the first direction D1, and the second circuit portions 162 respectively correspond to and partially overlap with the second conductive portions 152, so as to form an array.

In addition, multiple ones of the second bonding portion 172 are arranged to be spaced apart from each other along the first direction D1, and the second bonding portions 172 respectively correspond to and overlap with the second circuit portions 162. That is, the second bonding portion 172 can be disposed either between the surface of the first insulating layer 14 and the second circuit portion 162 or between a surface of the second conductive portion 152 and the second circuit portion 162, or both.

In some embodiments, each of the lighting units 18 in the array includes a micro p-n diode that has an n-doped layer, a p-doped layer, and one or more quantum well layers between the p-doped layer and the n-doped layer. The micro p-n diode includes one or more layers based on II-VI materials or III-V materials.

Figure 2:
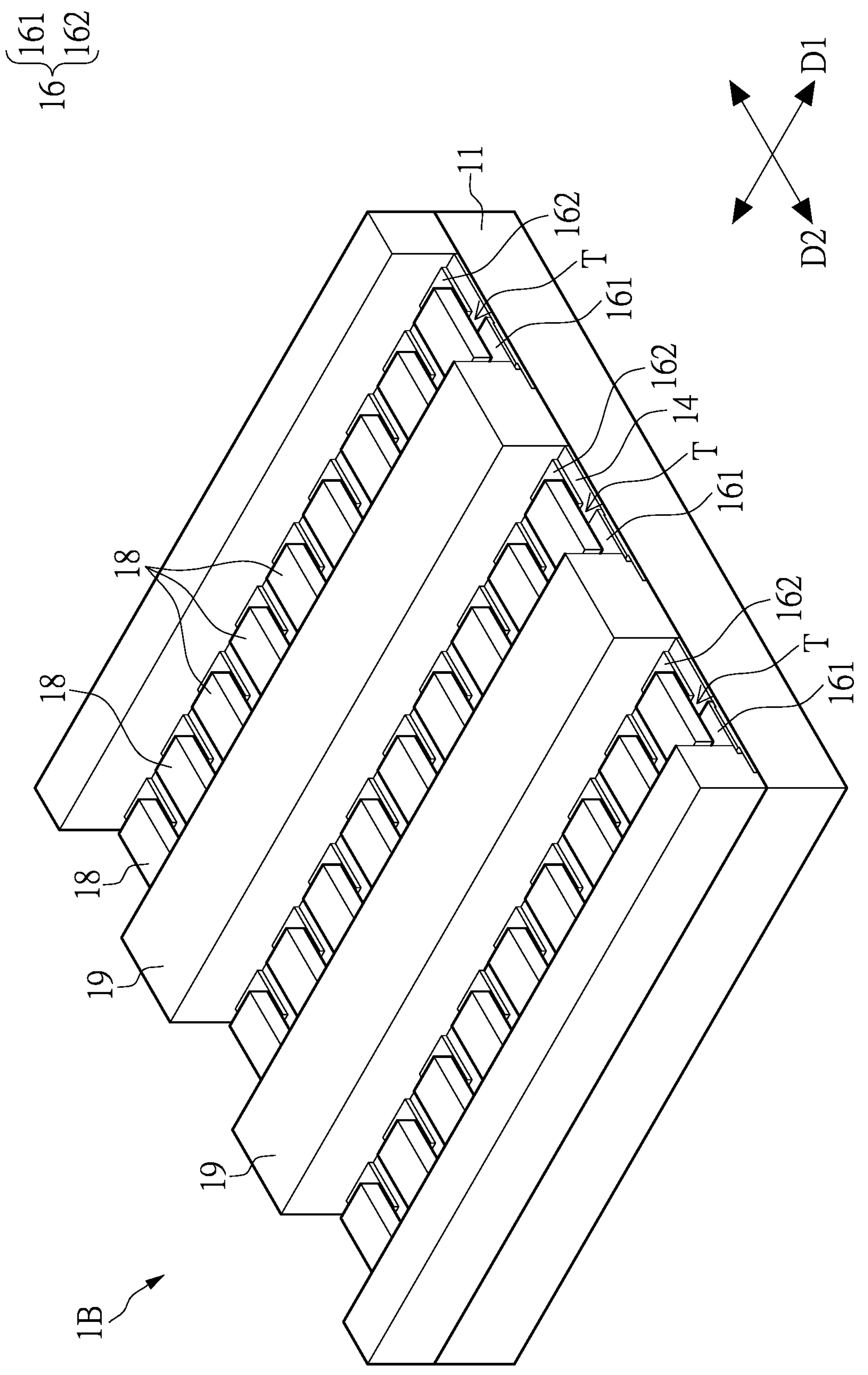
FIG. 2 is a schematic perspective view of the lighting module according to one embodiment of the present disclosure.

The carrier 11 can be a transparent material, but is not limited to glass, quartz, plastics, etc. The first direction D1 is not parallel to the second direction D2. In certain embodiments, the first direction D1 is orthogonal to the second direction D2. A material of the first metal circuit layer 12 can be, but is not limited to, a composite metal of chromium (Cr), silver/palladium/copper (Ag/Pd/Cu), titanium/silver (Ti/Ag), molybdenum nitride/aluminum/molybdenum nitride (MoN/Al/MoN), titanium/aluminum/titanium (Ti/Al/Ti), molybdenum-niobium (Mo—Nb), or chromium/aluminum/chromium (Cr/Al/Cr), or an alloy thereof. In certain embodiments, a material of the second metal circuit layer 16 is copper or a copper alloy. The first transparent conductive layer 13 and the second transparent conductive layer 15 can be made of the same material or different materials, and can be an indium tin oxide transparent conductive layer or an indium zinc oxide (IZO) transparent conductive layer (but are not limited thereto). The first insulating layer 14 can be opaque, transparent, or semi-transparent with respect to a visible wavelength. The first insulating layer 14 is formed by various materials, such as photo-definable acrylic acid, a photoresist, silicon dioxide ($SiO_2$), silicon nitride ($SiN_x$), poly(methyl methacrylate) (PMMA), benzocyclobutene (BCB), polyimide, acrylate, epoxy resins, and polyester (but is not limited thereto). In certain embodiments, the lighting unit 18 is a micro light-emitting diode (μLED), and lights emitted by the μLEDs are different from one another. Specifically, the μLEDs include a red μLED, a green μLED, and a blue μLED, and pixels are defined by the red μLED, the green μLED, and the blue μLED. However, the present disclosure is not limited thereto. The bonding structure layer 17 is a multi-layer structure, and its composition material can include at least one of titanium and a titanium alloy. In one embodiment, the bonding structure layer 17 contains titanium metal and allows the second metal circuit layer 16 to be well bonded to the surface of the first insulating layer 14. Through such a configuration, an electrical resistance value of the lighting module 1A can be effectively decreased, and a pressure drop can be reduced. As shown in FIG. 1 and FIG. 2, the first conductive portion 151 of the present embodiment includes a connection portion 1511 and an extension portion 1512. The connection portion 1511 is connected to the extension portion 1512 and disposed on the first side S1, and the extension portion 1512 is disposed on the first insulating layer 14.

Figure 3:
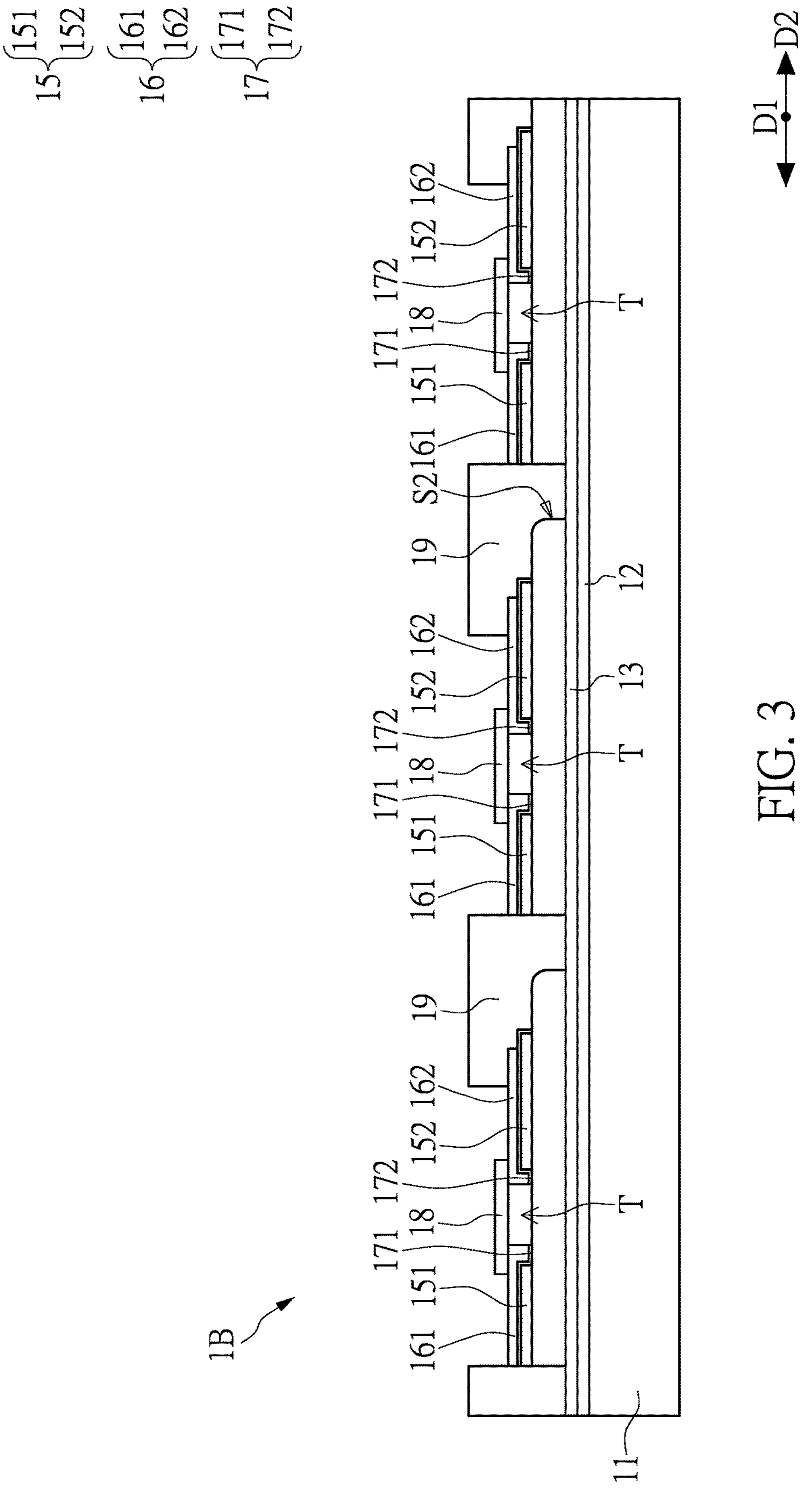
FIG. 3 is a front view of the embodiment shown in FIG. 2.

Referring to FIG. 2 and FIG. 3, which are to be read in conjunction with FIG. 1, FIG. 2 is a schematic perspective view of a lighting module 1B according to one embodiment of the present disclosure, and FIG. 3 is a front view of the embodiment shown in FIG. 2. Structures such as the bonding structure layer 17 are omitted from the embodiment shown in FIG. 2 and FIG. 3. The lighting module 1B has multiple ones of the groove T, and the lighting units 18 are arranged in arrays along the first direction D1 and the second direction D2. Along the second direction D2, adjacent ones of the lighting units 18 have a same color. On the same groove T, adjacent ones of the lighting units 18 have different colors. The lighting module 1B further includes second insulating layers 19. The second insulating layers 19 are light absorbent, extend along the first direction D1, and are respectively disposed on two sides of the groove T. The second insulating layers 19 can be a gray or black light-absorbing layer formed by light-absorbing particles in cooperation with various light-permeable materials, such as photo-definable acrylic acid, a photoresist, silicon dioxide ($SiO_2$), silicon nitride ($SiN_x$), poly(methyl methacrylate) (PMMA), benzocyclobutene (BCB), polyimide, acrylate, epoxy resins, and polyester (but are not limited thereto). Through configuration of the second insulating layers 19, crosstalk among adjacent ones of the lighting units 18 can be minimized.

Figure 4:
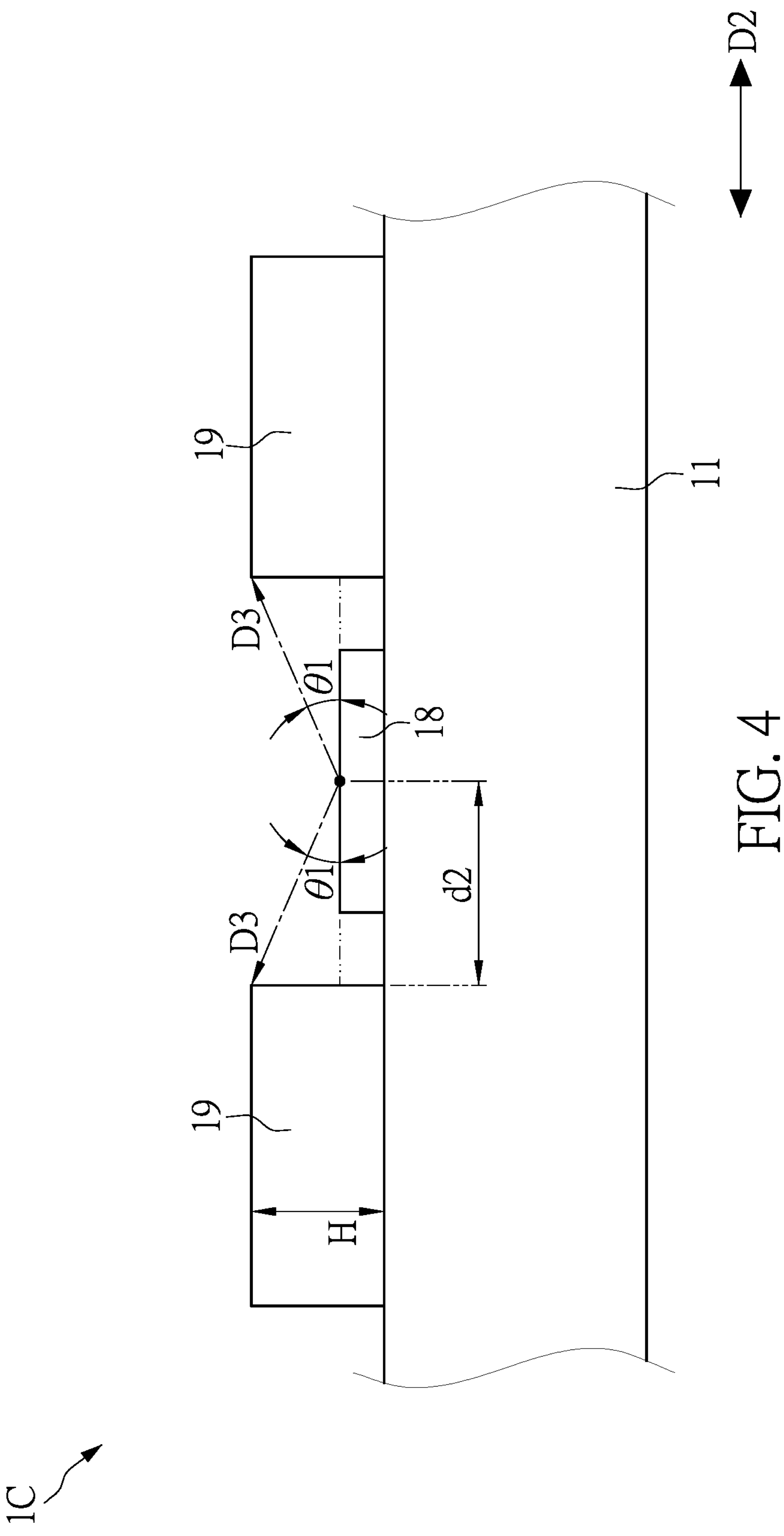
FIG. 4 is a front view of the lighting module according to one embodiment of the present disclosure.
Figure 5:
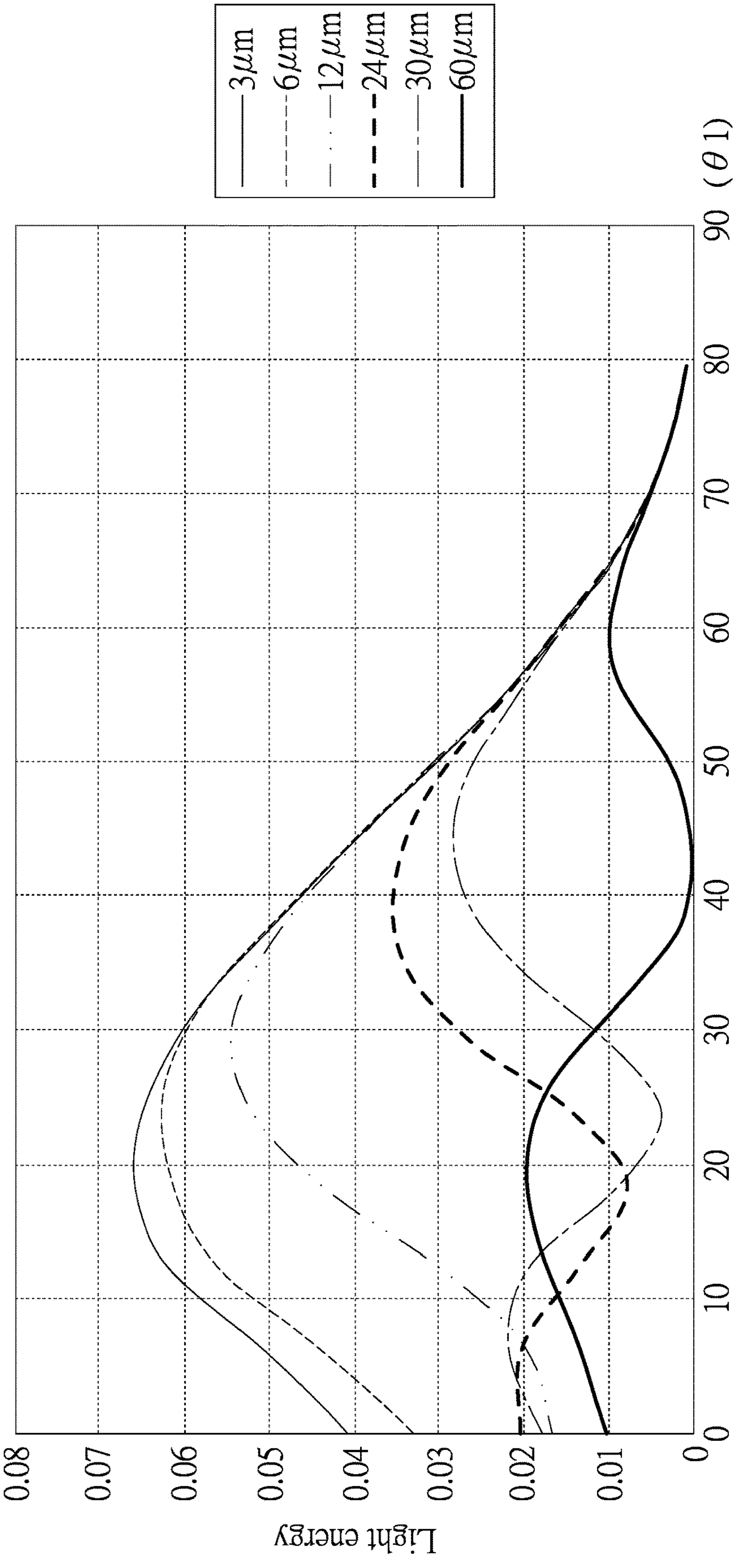
FIG. 5 is a curve diagram showing energy of light emitted by lighting units and reflected through a lateral side of a second insulating layer according to one embodiment of the present disclosure.

Referring to FIG. 4 and FIG. 5, FIG. 4 is a front view of a lighting module 1C according to one embodiment of the present disclosure, and FIG. 5 is a curve diagram showing energy of light emitted by lighting units and reflected through a lateral side of a second insulating layer according to one embodiment of the present disclosure. Only structures such as the carrier 11, the lighting units 18, and the second insulating layers 19 are kept for conveniently describing conditions of the second insulating layers 19 and the relationship between the lighting units 18 and the second insulating layers 19. In certain embodiments, the second insulating layer 19 has a light absorption rate greater than 50%, and preferably between 60% and 80% (especially at a lateral side). In certain embodiments, a thickness H of the second insulating layer 19 is required to be directly proportional to a thickness of the lighting unit 18. The thickness H of the second insulating layer 19 is typically not more than fifteen times, and is preferably two to ten times, the thickness of the lighting unit 18. For example, when the thickness of the lighting unit 18 is 6 um, the thickness H of the second insulating layer 19 preferably ranges between 12 um and 60 um. The thickness of the second insulating layer 19 affects the light absorption rate of the lateral side of the second insulating layer 19. In certain embodiments, the lighting module 1C includes an encapsulant (not shown in the drawings) that covers the lighting units 18 and the second insulating layers 19. The encapsulant used by a manufacturer has a refractive index less than that of the second insulating layer 19, so that light beams emitted by the lighting units 18 are more likely to laterally enter the second insulating layer 19. In this way, the light absorption rate of the second insulating layer 19 can be increased. From a front view perspective (as shown in FIG. 4), a connection line between a surface center of the lighting unit 18 and an edge of a top end of the second insulating layer 19 is defined as a projection direction D3. An angle θ1 is formed between the projection direction D3 and the second direction D2, and a range of the angle θ1 is between 12° and 62.4°. In certain embodiments, a distance d2 between the surface center of the lighting unit 18 and the second insulating layer 19 is between 5 um and 50 um. However, the present disclosure is not limited thereto. In FIG. 5, a curve diagram of light energy measured at the lateral side of the second insulating layers 19 having a light absorption rate of 80% and different thicknesses is shown. A vertical coordinate represents the light energy, and a horizontal coordinate represents the above-mentioned angle θ1. It can be observed from FIG. 5 that the second insulating layer 19 has a better light absorption performance at its lateral side when the thickness H is 60 um. When the thickness H is 60 um, an amplitude of the second insulating layer 19 absorbing the light energy from the lighting units 18 is great. As a result, upon measuring, the reflected light energy is low, and the crosstalk among adjacent ones of the lighting units 18 is effectively minimized.

Figure 6:
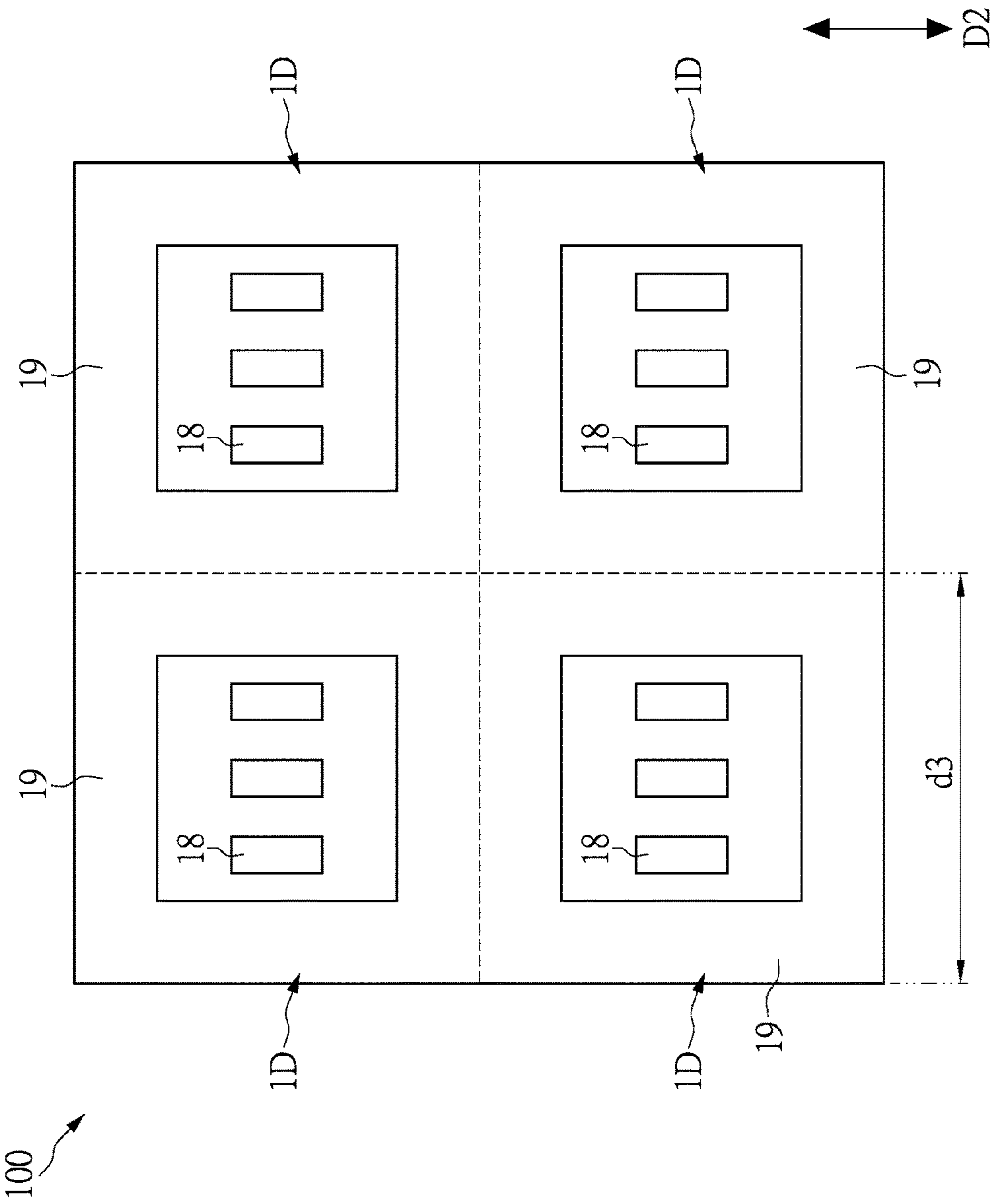
FIG. 6 is a top view of the lighting module according to one embodiment of the present disclosure.

Reference is made to FIG. 6, which is a top view of a lighting module 1D according to one embodiment of the present disclosure. In this embodiment, a quantity of the lighting module 1D is more than one, and a lighting wall 100 is formed by the multiple lighting modules 1D. Each of the lighting modules 1D has a unit length d3 of 100 μm, and includes three of the lighting units 18 (i.e., the red, green, and blue μLEDs). The μLEDs that are adjacent to each other along the second direction D2 have a same light-emitting color. In the lighting module 1D, the second insulating layer 19 is disposed at a periphery of the lighting units 18. Through such a configuration, the crosstalk problem of the adjacent lighting units 18 (having the same light-emitting color) can be improved.

Figure 7:
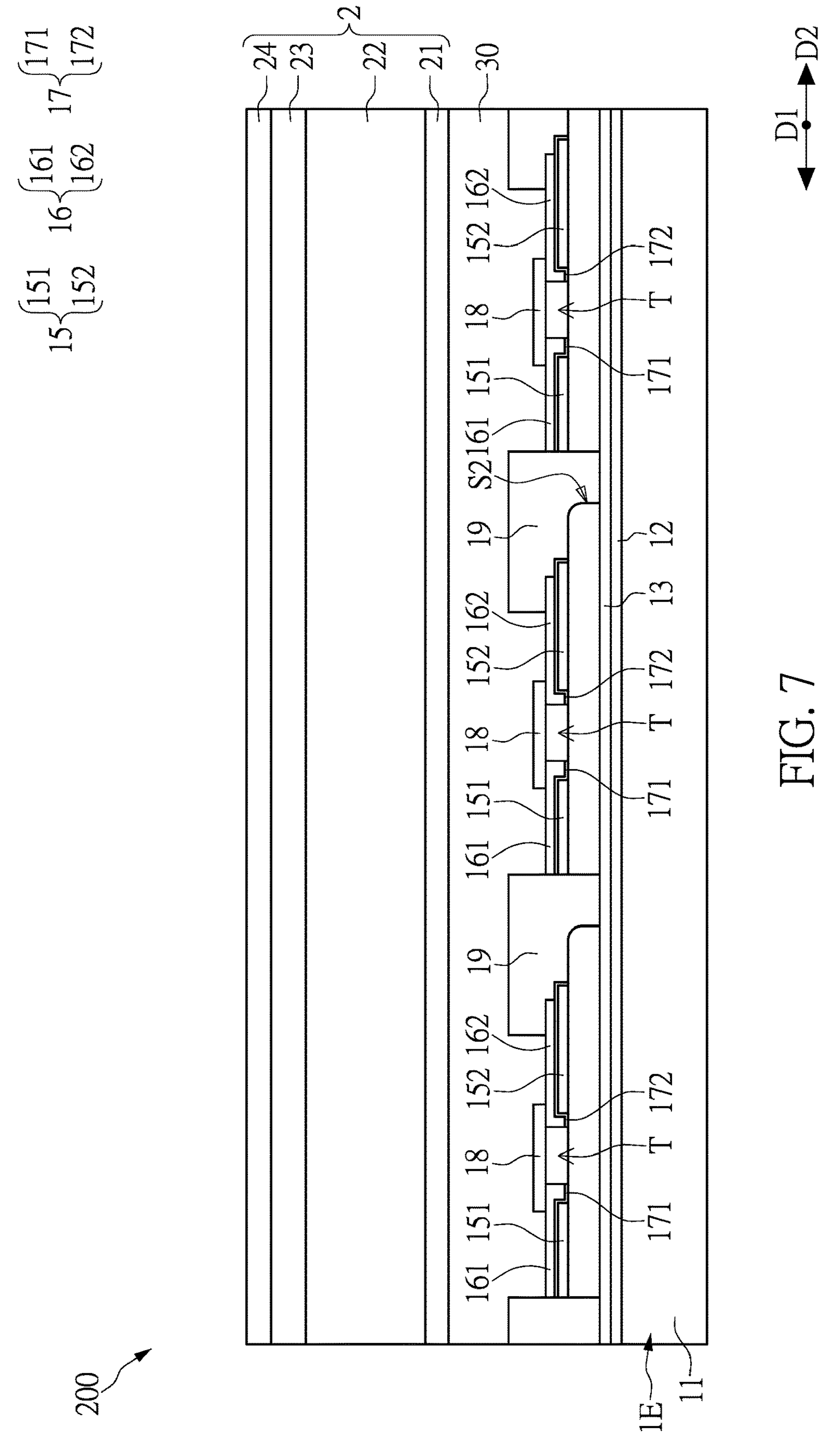
FIG. 7 is a front view of an electronic device according to one embodiment of the present disclosure.

Reference is made to FIG. 7, which is a front view of an electronic device 200 according to one embodiment of the present disclosure. The electronic device 200 has a display function, and can be, for example but not limited to, a smartwatch, a smartphone, or a video screen. In the embodiment shown in FIG. 7, the electronic device 200 includes a lighting module 1E and a touch panel 2. An encapsulant 30 is included in the lighting module 1E (in some embodiments, the encapsulant 30 is disposed between the lighting module 1E and the touch panel 2), and the touch panel 2 includes a first conductor 21, a glass substrate 22, a second conductor 23, and an insulator 24 from bottom to top. The first conductor 21 and the second conductor 23 can be, but are not limited to, indium tin oxide. The insulator 24 can be, but is not limited to, silicon dioxide ($SiO_2$). Since the lighting module 1E of the electronic device 200 is configured to include the bonding structure layer 17 (i.e., the first bonding portion 171 and the second bonding portion 172) and the second insulating layers 19, the second metal circuit layer 16 can be well boned to the surface of the first insulating layer 14 via the bonding structure layer 17, thereby reducing electrical resistance inside the lighting module 1E and a driving voltage. The lateral side of the second insulating layers 19 can absorb light, so that the crosstalk problem of the same-colored lighting units 18 on adjacent ones of the grooves T can be improved.

Figure 8:
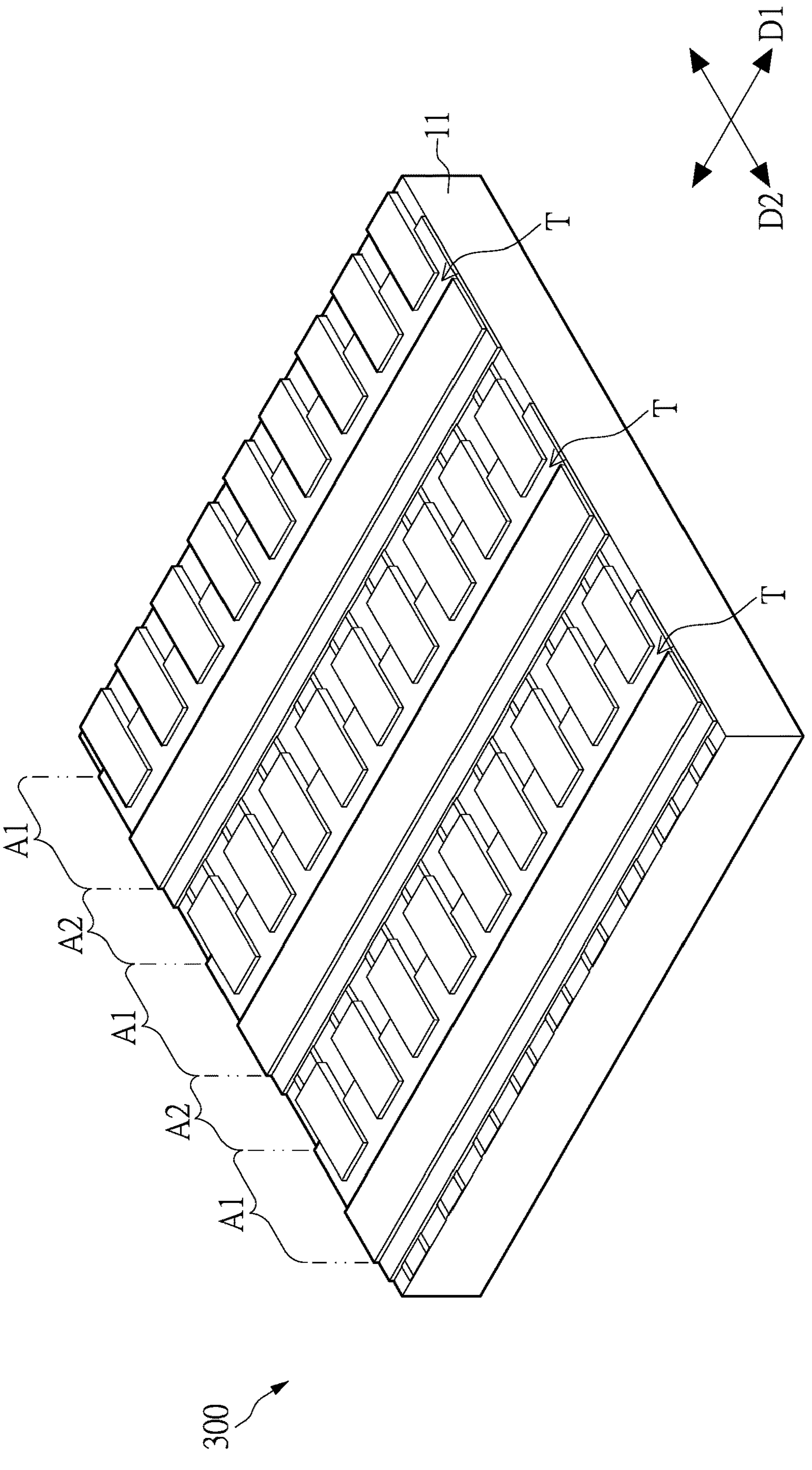
FIG. 8 is a schematic view showing a circuit structure of a display panel according to one embodiment of the present disclosure.

Reference is made to FIG. 8, which is a schematic view showing a circuit structure of a carrier of a display panel 300 according to one embodiment of the present disclosure. The display panel 300 includes the carrier 11, a plurality of wiring parts (which will be described below), and a light-absorbing layer. It should be noted that, in order to show the structure of the wiring parts and an extending direction, the light-absorbing layer is omitted from FIG. 8. A display area A1 and a non-display area A2 are defined on the carrier 11. The wiring parts are disposed on a surface of the display area A1, each of the wiring parts has an extension portion, and the extension portion extends to the non-display area A2. The light-absorbing layer is disposed on the non-display area A2 (as shown in FIG. 2). A height of the light-absorbing layer is greater than a height of the wiring parts, and the light-absorbing layer covers the extension portions and is at least more than 12 um. In certain embodiments, the light-absorbing layer is an insulating layer.

In certain embodiments, the carrier 11 is a transparent substrate, and each of the wiring parts is a stacked combination of a transparent conductive layer and a metal conductive layer. As the stacked combination of the transparent conductive layer and the metal conductive layer, the wiring part can be, for example, a stacked combination of the second transparent conductive layer 15 and the second metal circuit layer 16 shown in the embodiment of FIG. 1. In certain embodiments (as shown in FIG. 2), the lighting units 18 are disposed on the display area A1, and two sides of the bottom portion of each of the lighting units 18 are respectively connected to the wiring parts. The wiring parts further include a common anode circuit structure arranged along the first direction D1 in the display area A1, and the wiring parts as individual cathodes enable the corresponding lighting units 18 to light up independently. In certain embodiments (as shown in FIG. 4), the connection line between the surface center of the lighting unit 18 and an edge of a top end of the light-absorbing layer is defined as the projection direction D3. The angle 61 is formed between the projection direction D3 and a surface of the lighting unit 18, and the range of the angle θ1 is between 12° and 62.4°. The light-absorbing layer can be, for example, the second insulating layer 19 shown in the embodiment of FIG. 1. In certain embodiments, a thickness of the light-absorbing layer is two to ten times the thickness of the lighting unit 18. In the embodiment shown in FIG. 8, the display panel 300 further includes an insulating layer (e.g., the first insulating layer 14 shown in the embodiment of FIG. 1). The insulating layer is disposed on the carrier 11, and the wiring parts are disposed on the insulating layer.

Beneficial Effects of the Embodiments

In conclusion, in the lighting module, the electronic device, and the display panel provided by the present disclosure, by virtue of "disposing the bonding structure layer that includes the first bonding portion and the second bonding portion" and "the first bonding portion being disposed between the surface of the first insulating layer and the first circuit portion, and the second bonding portion being disposed between the surface of the first insulating layer and the second circuit portion," a driving resistance of the lighting module and a pressure drop can be reduced. Specifically, in one embodiment, the material of the second metal circuit layer is copper or a copper alloy, and the composition material of the bonding structure layer includes at least one of titanium and a titanium alloy. The bonding structure layer allows the second metal circuit layer to be stably bonded to the first insulating layer, thereby significantly reducing the driving voltage of the lighting module.

In one embodiment, by virtue of "the lighting module further including the two second insulating layers" and "the two second insulating layers being light absorbent, extending along the first direction, and being respectively disposed on the two sides of the groove," the crosstalk among the lighting units can be minimized.

In one embodiment, the electronic device (such as a smartphone and a smartwatch) includes the above-mentioned lighting module, so that the crosstalk among the pixels can be minimized.

In one embodiment, by virtue of "the display area and the non-display area being defined on the carrier," "the wiring parts being disposed on the surface of the display area, each of the wiring parts having the extension portion, and the extension portion extending to the non-display area," and "the light-absorbing layer being disposed on the non-display area, the height of the light-absorbing layer being greater than the height of the wiring parts, and the light-absorbing layer covering the extension portions and being at least more than 12 um," the crosstalk among the lighting units can be minimized when the lighting units are disposed subsequent to the light-absorbing layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A lighting module, comprising:

a carrier;

a first metal circuit layer extending along a first direction and disposed on the carrier;

a first transparent conductive layer extending along the first direction and covering the first metal circuit layer;

a first insulating layer disposed on the first transparent conductive layer, wherein two sides of the first insulating layer are respectively defined as a first side and a second side;

a second transparent conductive layer including a first conductive portion and a second conductive portion, wherein the first conductive portion is connected to the first transparent conductive layer and covers one portion of the first insulating layer, the second conductive portion is disposed on another portion of the first insulating layer, and a pitch is defined between the second conductive portion and the first conductive portion;

a second metal circuit layer including a first circuit portion and a second circuit portion, wherein the first circuit portion covers the first conductive portion, the second circuit portion covers the second conductive portion, and a groove is formed between the second circuit portion and the first circuit portion;

a bonding structure layer including a first bonding portion and a second bonding portion, wherein the first bonding portion is disposed between a surface of the first insulating layer and the first circuit portion, and the second bonding portion is disposed between the surface of the first insulating layer and the second circuit portion; and a plurality of lighting units arranged corresponding to the groove, wherein a positive electrode and a negative electrode of each of the lighting units are connected to the first circuit portion and the second circuit portion, respectively.

2. The lighting module according to claim 1, wherein the first conductive portion includes a connection portion and an extension portion, the connection portion is connected to the extension portion and disposed on the first side, and the extension portion is disposed on the first insulating layer.

3. The lighting module according to claim 1, wherein a material of the second metal circuit layer is copper or a copper alloy, and a composition material of the bonding structure layer includes at least one of titanium and a titanium alloy.

4. The lighting module according to claim 1, further comprising two second insulating layers, wherein the two second insulating layers are light absorbent, extend along the first direction, and are respectively disposed on two sides of the groove.

5. The lighting module according to claim 4, wherein a thickness of the second insulating layer is two to ten times a thickness of the lighting unit.

6. The lighting module according to claim 4, wherein a connection line between a surface center of the lighting unit and an edge of a top end of the second insulating layer is defined as a projection direction, an angle is formed between the projection direction and a second direction that is orthogonal to the first direction, and a range of the angle is between 12° and 62.4°.

7. The lighting module according to claim 4, wherein, along a second direction that is orthogonal to the first direction, a distance between a surface center of the lighting unit and the second insulating layer is between 5 μm and 50 um.

8. The lighting module according to claim 4, wherein a quantity of the groove is more than one; wherein, along a second direction that is orthogonal to the first direction, adjacent ones of the lighting units have a same color; wherein, on the same groove, adjacent ones of the lighting units have different colors.

9. The lighting module according to claim 4, wherein the second insulating layer has a light absorption rate greater than 50%.

10. The lighting module according to claim 1, wherein multiple ones of the second conductive portion are arranged to be spaced apart from each other along the first direction, multiple ones of the second circuit portion are arranged to be spaced apart from each other along the first direction, and the second circuit portions respectively correspond to and overlap with the second conductive portions, so as to form an array.

11. The lighting module according to claim 10, wherein multiple ones of the second bonding portion are arranged to be spaced apart from each other along the first direction, and the second bonding portions respectively correspond to and overlap with the second circuit portions.

12. The lighting module according to claim 10, wherein each of the lighting units in the array includes a micro p-n diode that has an n-doped layer, a p-doped layer, and one or more quantum well layers between the p-doped layer and the n-doped layer; wherein the micro p-n diode includes one or more layers based on II-VI materials or III-V materials.

13. An electronic device, comprising:
a touch panel;
the lighting module as claimed in claim 4; and
an encapsulant disposed between the lighting module and the touch panel, wherein the touch panel includes a first conductor, a glass substrate, a second conductor, and an insulator from bottom to top.

14. A display panel, comprising:
a carrier, wherein a display area and a non-display area are defined on the carrier;
a plurality of wiring parts disposed on a surface of the display area, wherein each of the wiring parts has an extension portion, and the extension portion extends to the non-display area; and
a light-absorbing layer disposed on the non-display area, wherein a height of the light-absorbing layer is greater than a height of the wiring parts, and the light-absorbing layer covers the extension portions and is at least more than 12 μm in thickness;
wherein a plurality of lighting units are disposed on the display area, and two sides of a bottom portion of each of the lighting units are respectively connected to the wiring parts.

15. The display panel according to claim 14, wherein the carrier is a transparent substrate, and each of the wiring parts is a stacked combination of a transparent conductive layer and a metal conductive layer.

16. The display panel according to claim 14, wherein a connection line between a surface center of the lighting unit and an edge of a top end of the light-absorbing layer is defined as a projection direction, an angle is formed between the projection direction and a surface of the lighting unit, and a range of the angle is between 12° and 62.4°.

17. The display panel according to claim 14, wherein a thickness of the light-absorbing layer is two to ten times a thickness of the lighting unit.

18. The display panel according to claim 14, further comprising an insulating layer, wherein the insulating layer is disposed on the carrier, and the wiring parts are disposed on the insulating layer.

19. The display panel according to claim 14, wherein the wiring parts further include a common anode circuit structure arranged in the display area, and the wiring parts formed as individual cathodes enable the corresponding lighting units to light up independently.

* * * * *